(12) United States Patent
Gomez et al.

(10) Patent No.: US 11,847,267 B2
(45) Date of Patent: Dec. 19, 2023

(54) INPUT DEVICE TRACKING SYSTEMS

(71) Applicant: HEWLETT-PACKARD DEVELOPMENT COMPANY, L.P., Spring, TX (US)

(72) Inventors: Adolfo Adolfo Gomez, Fort Collins, CO (US); Jon David Danielson, Fort Collins, CO (US); Mark Allen Lessman, Fort Collins, CO (US); Alexander Klug, Fort Collins, CO (US); Henry Wang, Fort Collins, CO (US)

(73) Assignee: HEWLETT-PACKARD DEVELOPMENT COMPANY, L.P., Spring, TX (US)

(*) Notice: Subject to any disclaimer, the term of this patent is extended or adjusted under 35 U.S.C. 154(b) by 0 days.

(21) Appl. No.: 17/741,672

(22) Filed: May 11, 2022

(65) Prior Publication Data

US 2023/0367401 A1 Nov. 16, 2023

(51) Int. Cl.
*G06F 3/02* (2006.01)
*G06F 3/0346* (2013.01)
*H03K 17/96* (2006.01)

(52) U.S. Cl.
CPC ............ *G06F 3/021* (2013.01); *G06F 3/0346* (2013.01); *H03K 17/962* (2013.01)

(58) Field of Classification Search
CPC ........ G06F 1/163; G06F 1/1694; G06F 3/011; G06F 3/012; G06F 3/0338; G06F 2203/0331; G06F 3/033; G06F 3/0346; G02B 27/0093; G05G 9/047; B60K 2370/135; H01H 25/04; A63F 13/20; A63F 13/23
See application file for complete search history.

(56) References Cited

U.S. PATENT DOCUMENTS

| | | | | |
|---|---|---|---|---|
| 6,213,790 | B1 * | 4/2001 | Kakinoki | H05K 5/0269 439/95 |
| 2008/0222571 | A1 * | 9/2008 | Yoshioka | G06F 3/0362 715/841 |
| 2015/0358790 | A1 * | 12/2015 | Nasserbakht | G06F 1/1698 726/19 |
| 2017/0248696 | A1 * | 8/2017 | Vyssotski | G01S 5/30 |
| 2019/0163279 | A1 * | 5/2019 | Grant | A63F 13/98 |
| 2019/0320265 | A1 * | 10/2019 | Liu | H04W 84/12 |
| 2020/0089334 | A1 * | 3/2020 | Tompkins | G06F 3/0338 |
| 2020/0244366 | A1 * | 7/2020 | Fan | H04B 10/6165 |
| 2020/0371588 | A1 * | 11/2020 | Gruben | G06F 3/017 |

(Continued)

*Primary Examiner* — Benjamin C Lee
*Assistant Examiner* — Nathan P Brittingham
(74) *Attorney, Agent, or Firm* — Quarles & Brady LLP

(57) ABSTRACT

In an example in accordance with the present disclosure, an input movement tracking device is described. The input movement tracking device comprises a tracking device housing and a connector to mechanically attach the tracking device housing to an input device. The input movement tracking device also includes an electrical connector to receive input from the input device to be transmitted to a host computing device. A tracking system disposed within the tracking device housing tracks a position and orientation of the tracking device housing and the input device in physical space and a transceiver disposed within the tracking device housing communicates with the host computing device.

20 Claims, 8 Drawing Sheets

(56) References Cited

U.S. PATENT DOCUMENTS

| | | | |
|---|---|---|---|
| 2021/0011556 A1* | 1/2021 | Atlas | G06F 3/011 |
| 2021/0041966 A1* | 2/2021 | Heer | G06F 3/04847 |
| 2022/0137705 A1* | 5/2022 | Hashimoto | G06T 19/20 |
| | | | 345/156 |

* cited by examiner

INPUT DEVICE TRACKING SYSTEMS

BACKGROUND

Input devices are coupled to computing devices to provide additional functionality to the computing device and to facilitate user interaction with the computing device. As a particular example, input devices may be used with an extended reality (XR) system to allow a user to become immersed in an XR environment wherein the user can interact with the XR environment. For example, a head-mounted display (HMD) allows a user to see, and become immersed in, any desired virtual scene. Input devices allow the user to interact with the virtual objects in the displayed virtual scene.

BRIEF DESCRIPTION OF THE DRAWINGS

The accompanying drawings illustrate various examples of the principles described herein and are part of the specification. The illustrated examples are given merely for illustration, and do not limit the scope of the claims.

Figure 1:
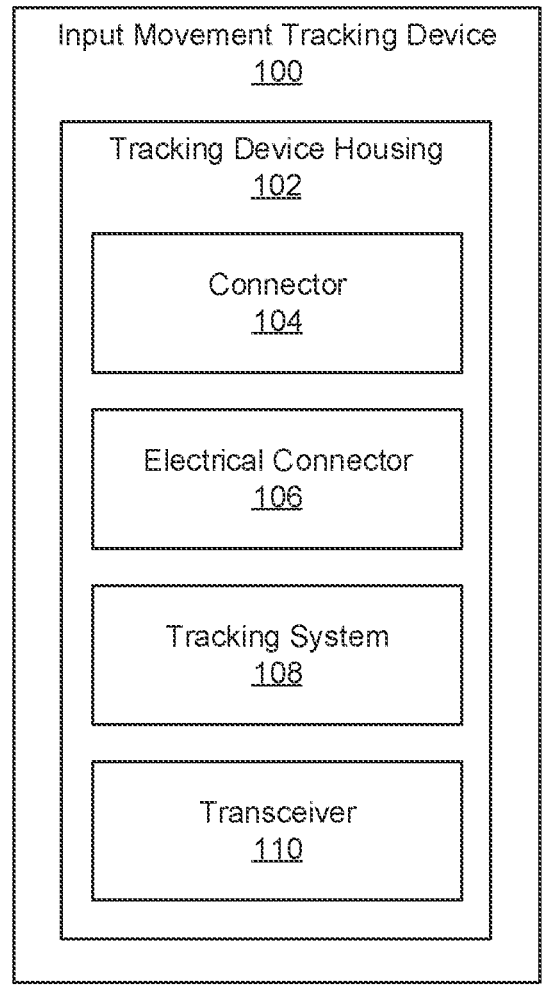
FIG. 1 is a block diagram of an input movement tracking device, according to an example of the principles described herein.

Throughout the drawings, identical reference numbers designate similar, but not necessarily identical, elements. The figures are not necessarily to scale, and the size of some parts may be exaggerated to more clearly illustrate the example shown. Moreover, the drawings provide examples and/or implementations consistent with the description; however, the description is not limited to the examples and/or implementations provided in the drawings.

DETAILED DESCRIPTION

Extended reality (XR) systems create an environment wherein a user can interact with real or digital objects within the environment. XR systems include virtual reality (VR) systems, augmented reality (AR) systems, and mixed reality (MR) systems. Such XR systems can include head-mounted displays (HMDs) to generate realistic images, sounds, and other human discernable sensations that simulate a user's physical presence in a virtual environment presented at the HMD. A VR system includes physical spaces and/or multi-projected environments. AR systems may include systems and devices that implement direct and/or indirect displays of a physical, real-world environment whose elements are augmented by computer-generated sensory input such as sound, video, graphics and/or global positioning system (GPS) data. MR systems merge real and virtual worlds to produce new environments and visualizations where physical and digital objects co-exist and interact in real time. For simplicity, VR systems, AR systems, and MR systems are referred to herein as XR systems.

XR systems as well as other computing devices rely on controllers to facilitate user interaction with a digital environment. For example, game controllers, which may include buttons, joysticks, directional pads, etc. to receive user input, transmit signals to the host system to control an avatar in a game. As a specific example, XR systems may include handheld controllers to allow the user to interact with the XR environment and XR objects within the XR environment.

While XR systems have undoubtedly generated a new and exciting field of information presentation and have greatly expanded the opportunities and capabilities for interaction and collaboration, some developments may further enhance XR system use and implementation in a variety of industries. For example, XR controllers, and non-XR controllers as well, allow user input to be received at a host device. Such controllers may also include components to track the movement of the controller in physical space. For example, as a user moves a controller in a circular motion, the tracking system of the controller may pass a signal such that a component in the XR environment, such as a tennis racket, may be moved in a similar circular motion.

However, as XR environments increase in the variability of input they can receive, i.e., gestural input, current controllers may be ill-suited to handle each different existing or newly developed input modality. For example, new input methods may be developed, such as glove or finger tracking, in which case a respective controller may include tracking and communication sub-systems. Including these tracking and communication sub-systems in each different controller may result in a controller that is complex, heavy, and burdensome for a user to interact with. Moreover, customization of each different use case may be difficult, if possible, for users without resources to perform a development project. Moreover, in some examples, some objects which are desired to be tracked may not have a tracking sub-system.

Accordingly, the present specification describes a modular input system that decouples the tracking and communication sub-systems from the input/output sub-system of a controller such that an input device does not include the tracking and communication sub-systems but can rather be coupled to an input movement tracking device which includes these sub-systems.

Specifically, the modular input system includes an input device that receives the input from the user and an input movement tracking device that is separate from the input device. The input movement tracking device includes a tracking system that collects positional and orientational data for any object to which it is attached. The input movement tracking device also includes components for receiving user input from the input/output sub-system of the input device and relaying the input to the host computing device. The input movement tracking device is separable, both mechanically and electrically, from the input device such that a single input movement tracking device is able to connect and interface with multiple input devices. That is, the present input movement tracking device decouples the tracking and communication sub-systems from the input device such that the modular input movement tracking device may be coupled to any variety of input devices. Doing so provides flexibility and customization in the generation of an XR environment and provides for simpler and more user-friendly input devices.

As a specific example, certain XR experiences integrate tracking and input controls into gameplay props. It may be that a prop is more efficiently presented when the tracking system is physically separate from the input device. As described above, a controller that has the input device and tracking system into a single controller does not allow for positioning the tracking elements separate from the input elements. As an example, for a VR experience based on sport fishing, the user may desire input elements near the fishing reel to mimic real-world use while having tracking elements positioned at the end of the rod to capture movements of the device that are relevant to this specific application. Current controllers may not facilitate this type of use. By comparison, the modular input system of the present specification allows the user to place just the tracking element on the prop, thereby reducing the total added mass and increasing the utility of both the tracking and input data.

As yet another example, an XR system may be compatible with different input devices. When an inseparable controller is used, each different controller may include a tracking sub-system, which may be redundant. Accordingly, by using a separable input movement tracking device as described above, each input device may be simpler and more cost effective by removing the tracking and communication sub-system from the input device as such sub-systems would be provided by the separable tracking device.

Still further, were there an update to the tracking/communication sub-systems, the XR system would have to push this update to each of multiple controllers. By implementing a separable input movement tracking device that is used for multiple input devices, this pushing of an update is simplified as the update is pushed to a single input movement tracking device, rather than multiple controllers, each with their own tracking sub-system.

The ability to separate tracking from input may also enhance training experiences where it is desirable to easily track real-world non-computing objects like tools, medical devices, utensils, etc. Such objects may not have input elements and/or tracking capability. The representation of these type of physical, non-computing objects in an XR environment has been constrained as developers are bound by controllers already available in the marketplace. Existing controllers may not be good proxies for many tools and objects used in XR experiences, as inputs are to comply with generic button and trigger layouts. For example, abstracting the unique form factor and exact inputs of an industry-specialized piece of equipment like a welding torch into a XR controller that has its roots in gaming holds back the potential knowledge retention value of training in an XR environment. Users may be able to develop controllers themselves. However, this development may be technically challenging and complex, if not impossible. Furthermore, developing a controller to emulate a "real-world" physical device may introduce unnecessary cost and complexity and may remove relevant physical traits which generate the realistic experience.

To provide inputs from a real-world, non-computing physical object that can be easily read by a host computing device, the present modular input system can also enhance the XR experience by adding capacitive sensors. These capacitive sensors enable user-configurable and customizable touch and proximity sensing inputs which can be added to any physical object, even non-computing objects such as tools, utensils, etc. Such a capacitive sensor may be applied to any physical object and provide touch and movement input to the physical object. Developers may utilize the functionality of these capacitive sensors while avoiding expensive hardware development and integration programs.

The capacitive sensor is paired with the input movement tracking device which controls the capacitive sensors and provides integration into the XR system for volumetric tracking and sensor inputs. Via a user interface, a user may allow for various input customization such as real-time raw data, input sensitivity and range, thresholding for "trigger" functions, and many others.

As such the present modular input system and input movement tracking device may be implemented with 1) an input device that natively includes user input elements, which user input is intended to be passed to a host computing device and 2) physical objects which are not natively intended to pass inputs to a host computing device, i.e., a drill, or other tool and/or utensil. In this second example, the input device may be the physical object with an input element attached thereto.

Specifically, the present specification describes an input movement tracking device. The input movement tracking device includes a tracking device housing and a connector to mechanically attach the tracking device housing to an input device such as an electronic controller or a non-computing physical object. The input movement tracking device also includes an electrical connector to receive input from the input device to be transmitted to a host computing device. A tracking system disposed within the input movement tracking device tracks a position and orientation of the housing and the input device (e.g., electronic controller without tracking sub-system or non-computing physical object) in physical space and a transceiver disposed within the tracking device housing communicates with the host computing device.

The present specification also describes a modular input system. The modular input system includes the input movement tracking device which includes the tracking device housing, connector, a first electrical connector, tracking system and transceiver as described above. The modular input system also includes the input device which is separable and modular to the input movement tracking device. The input device includes an input device housing, an input element integrated in the input device housing to receive input, and a second electrical connector to interact with the first electrical connector of the tracking device to transmit input to the input movement tracking device.

The present specification also describes a non-transitory machine-readable storage medium encoded with instructions executable by a processor. The machine-readable storage medium with instructions to 1) receive input at an input movement tracking device and from a separable input device of an XR (XR) system and 2) transmits the input to a host XR computing device. The machine-readable storage medium also includes instructions to 1) track a position and orientation of the input device via a tracking system of the input movement tracking device and 2) transmit the position and orientation of the input device to the host XR computing device. Note that while reference may be made to host XR systems and XR input devices, the devices and systems described herein may be implemented in non-XR systems and devices.

In summary, using such a device, system, and machine-readable storage medium may, for example, 1) allow for different input devices of different types to be implemented with a single input movement tracking device; 2) facilitate different input styles (e.g., standard, pro), that may have more or less features; 3) facilitate different controller ergonomics (e.g., small, medium large; 4) facilitate integration of application specific controllers (e.g., sports equipment, pens, paint brushes) as well as user-made (e.g. 3D printed) controllers; 5) support multiple tracking systems on a single object; 6) allow tracking of non-computing physical objects. However, it is contemplated that the devices disclosed herein may address other matters and deficiencies in a number of technical areas, for example.

As used in the present specification and in the appended claims, the term "input device" refers to a device from which input is received, which input is transmitted to a computing system, such as an XR system. The input device may take a variety of forms. For example, the input device may be a controller, such as a gaming or XR controller. In another example, the input device may be physical object with a sensor, such as a touch sensitive sensor adhered to a real-world, non-computing object such as a staff or a drill.

As used in the present specification and in the appended claims, the term "module" and "controller" refer to components that include a processor and a memory device. The processor includes the circuitry to retrieve executable code from the memory and execute the executable code. As specific examples, the controller as described herein may include machine-readable storage medium, machine-readable storage medium and a processor, an application-specific integrated circuit (ASIC), a semiconductor-based microprocessor, and a field-programmable gate array (FPGA), and/or other hardware device.

As used in the present specification an in the appended claims, the term "memory" includes a non-transitory storage medium, which machine-readable storage medium may contain, or store machine-usable program code for use by or in connection with an instruction execution system, apparatus, or device. The memory may take many forms including volatile and non-volatile memory. For example, the memory may include Random-Access Memory (RAM), Read-Only Memory (ROM), optical memory disks, and magnetic disks, among others. The executable code may, when executed by the respective component, cause the component to implement the functionality described herein. The memory may include a single memory element or multiple memory elements.

Further, as used in the present specification and in the appended claims, the term XR environment refers to that environment presented by the XR system and may include an entirely digital environment, or an overlay of a digital environment on a physical scene viewed by the user. For example, the XR environment may be a VR environment which includes physical spaces and/or multi-projected environments. AR environments may present direct and/or indirect displays of a physical, real-world environment whose elements are augmented by computer-generated sensory input such as sound, video, graphics and/or global positioning system (GPS) data. XR environments merge real and virtual worlds to produce new environments and visualizations where physical and digital objects co-exist and interact in real time.

As used in the present specification and in the appended claims, the term "a number of" or similar language is meant to be understood broadly as any positive number including 1 to infinity.

FIG. 1 is a block diagram of an input movement tracking device (100), according to an example of the principles described herein. As described above, the input movement tracking device (100) refers to a physical structure that is attachable to and removable from an input device which receives input to be acted upon by a host computing device.

In one example, the input device to which the input movement tracking device (100) is attached is an XR input device which receives user input that is ultimately used to generate or manipulate an object within an XR environment. As described above, such an XR input device may not include a tracking and communication sub-systems, but may include just the input sub-system. In this example, the XR system may include an HMD to display visual content on a display panel. An HMD covers the eyes of the user and presents the visual information in an enclosed environment formed by the HMD housing and the user's face.

As described above, the term XR encompasses, VR, MR, and AR such that an extended reality HMD encompasses VR HMDs, MR HMDs, and AR HMDs. The content that is displayed on the HMD may be provided by a host computing device such as a personal computer (PC), all-in-one device, gaming console, or the like. Accordingly, the HMD may include an input port such as a display port to receive the external visual content to be displayed on the HMD from a connected host computing device. While reference is made to an example, where the input device is an XR input device, the input device may be implemented in non-XR environments, such as for recreation on a monitor of a computing device.

Figure 3:
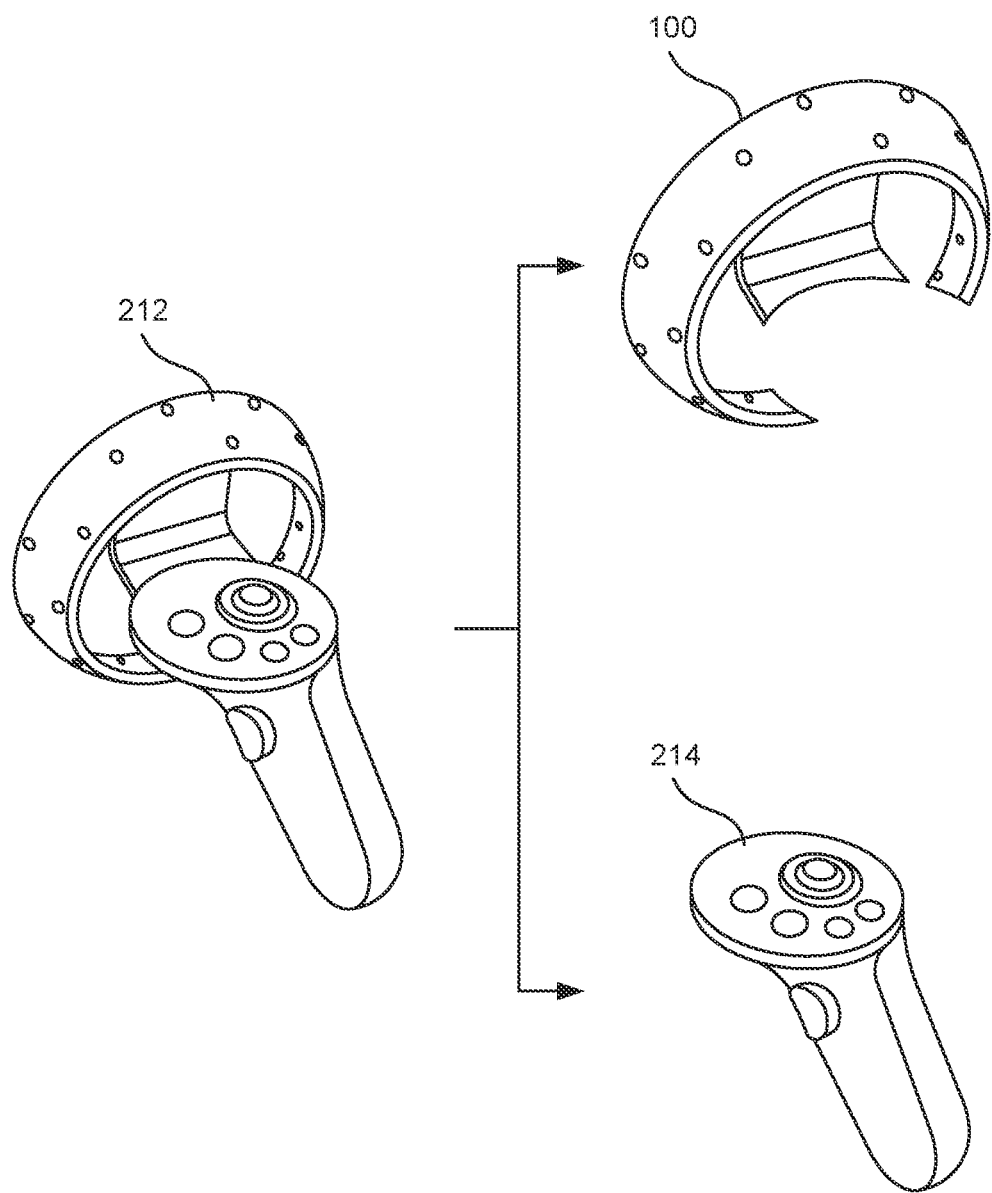
FIG. 3 is an isometric view of a modular input system, according to an example of the principles described herein.
Figure 4:
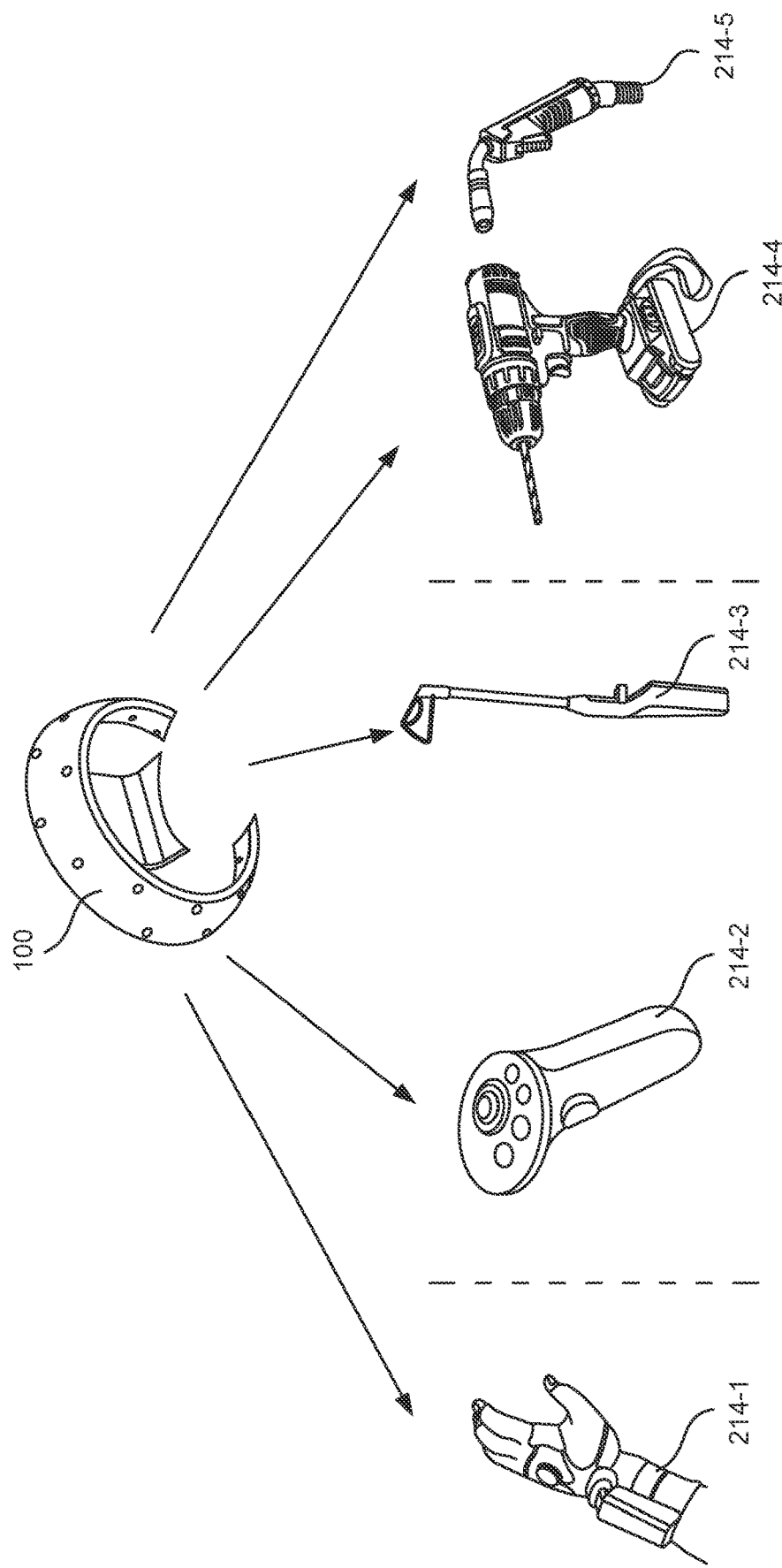
FIG. 4 is an isometric view of a modular input system with various input devices, according to an example of the principles described herein.

The input movement tracking device (100) includes a tracking device housing (102) to retain the other components of the input movement tracking device (100). The tracking device housing (102) may be separate from the input device. That is, as depicted in FIGS. 3 and 4, the input movement tracking device (100) and its corresponding sub-systems, may be selectively removed from, and attached to, a variety of input devices.

Accordingly, the input movement tracking device (100) includes a connector (104) to mechanically attach the tracking device housing (102) to an input device. The form of the connector (104) may vary. For example, the connector may be an adhesive film. In another example, the connector (104) may be a mechanical retention feature, such as a deflectable clip, that mates with a corresponding retention feature, such as a slot on the input device. As another example, the connector (104) may be a threaded attachment such as a screw that is received in a threaded hole in an input device. While reference is made to types of connectors (104), other types of connectors (104) may be implemented in accordance with the principles herein to selectively and removably attach the tracking device housing (102) to the input device.

The input movement tracking device (100) may also include an electrical connector (106) to receive input from the input device, which input is to be transmitted to the host computing device. That is, as described above, the input device is to receive input, whether such input is from a user or a sensor. The host computing device, upon receiving the input, may manipulate the digital environment, which may be an XR environment, based on the input. For example, a user may depress a button on the input device. A signal indicating this depression is passed to the host computing device which maps the action to a particular digital function. As such, the digital environment is manipulated based on user input. As another example, a touch sensor disposed on a non-computing device may detect user touch. The sensor output may be passed to the host computing device which maps the action to a particular digital function. As such, the digital environment is manipulated based on the detected touch.

The electrical connector (106) disposed on the tracking device housing (102) receives this input from the input device. In addition to receiving input from the input device, the electrical connector (106) may transmit signals to the input device. For example, responsive to an interaction of the user with an object in the XR environment, the host computing device may generate a vibration pattern that is transmitted to the user through the input device. This haptic feedback signal is transmitted to the input device through this electrical connector (106).

The input signal may be received from a variety of sources. For example, the input could be user input received at user interface elements such as buttons, direction pads, and touch sensitive sensors. In other examples, the input may be non-user input received from an object to which an input element is coupled. For example, gyroscopes or accelerometers may be affixed to an object. In this example, the gyroscope or accelerometer output may be transmitted from the input device to the input movement tracking device (100) via the electrical connector (106).

The electrical connector (106) may be wireless or wired. For example, the electrical connector (106) may be a Bluetooth or near-field communication (NFC) device. The electrical connector (106) may be a wired electrical connector (106). One specific example of a physical electrical connector (106) is an exposed electrical pad that interfaces with pogo pins on the input device. As another example, the electrical connector (106) may be the pogo pins which interact with electrical pads on the input device. While reference is made to a particular electrical connector (106), any type of electrical connector (106) may be implemented in accordance with the principles described herein.

In an example, the electrical connector (106) may form part of the connector (104). That is, the electrical connector (106) may interface with a corresponding electrical connector on the input device as the connector (104) receives the input device. This electromechanical interface may align with industry standards to allow for seamless integration of third-party input and output devices. This may include a wide variety of features through analog input/output control, or could be extended further to utilize standard communication protocols with other digital devices. For instance, Serial Peripheral Interface (SPI), Inter-Integrated Circuit (I2C), Universal Synchronous/Asynchronous Receiver/Transmitter (USART), or other protocols could be incorporated to interface with microcontrollers on the input device which may provide additional input and output functionality. Examples include complex input sensor function with pre-processing, haptic feedback outputs, light-emitting diode (LED) indicators, etc.

As described above, the input movement tracking device (100) includes a tracking system (108) disposed within the tracking device housing (102) to track a position and orientation of the tracking device housing (102) and the input device in physical space. That is, as described above, the input movement tracking device (100) may independently track an input device, such that no tracking device is positioned on the input device itself.

The tracking system (108) may be an optical constellation tracking system (108). In this example, the host tracking device may project a constellation of visible or non-visible energy beams towards a surface on the host device. The host device has a camera which can see the unique layout of the optical constellation and determine the location of the input movement device housing (102) in physical space.

While reference is made to one tracking system (108), e.g., an optical constellation tracking system (108), the tracking system (108) may be of different types, including for example an ultrasonic tracking system which uses a time of flight of an ultrasonic pulse to determine the position and orientation of the tracking device housing (102). The type of tracking system (108) implemented may be selected based on a physical size and mass of the tracking system (108) and/or input movement tracking device (100), power consumption, or other criteria.

In addition to determining the physical position of the tracking device housing (102), the tracking system (108) may determine the orientation of the tracking device housing (102). As such, the tracking system (108) may determine the six degrees of freedom (6DoF) of the tracking device housing (102). As the tracking device housing (102) is affixed to the input device, in determining the position and orientation of the tracking device housing (102), the tracking system (108) also determines the position and orientation of the input device to which the input movement tracking device (100) is attached.

Note that in some examples, the input movement tracking device (100) provides movement tracking when the input device itself does not have a tracking system. Accordingly, an input movement tracking device (100) that is attached to the input device allows for device tracking regardless of whether the input device has such a capability. Moreover, as the input movement tracking device (100) is separably connectable to various input devices, the input movement tracking device (100) can be used to track multiple input devices.

The input movement tracking device (100) also includes a transceiver (110) disposed within the tracking device housing (102) to communicate with the host computing device. Specifically, the transceiver (110) transfers input to the host computing device, and in some examples, transfers feedback from the host computing device towards the input device. Such a transceiver (110) may be wireless or wired. That is, the transceiver (110) may include a Wi-Fi or Bluetooth transceiver that communicates with a corresponding radio in the host computing device.

The information that is transmitted includes 1) the position and orientation data collected from the tracking system (108) and 2) any input received at the input movement tracking device (100) via the electrical connector (106). As such, the input movement tracking device (100) not only tracks the movement and position of the input device, but also forwards on any received input from the input device to the host computing device. In an example where the XR input device is an XR system, the transceiver (110) may transmit the input and the position and orientation information to a head-mounted display (HMD) of the XR system for manipulation of the XR scene displayed on the HMD.

In addition to transmitting user information and position and orientation data, the transceiver (110) may receive information to be transmitted to the input device. For example, responsive to events in the XR environment, the host computing device may generate haptic feedback. The transceiver (110) receives the haptic feedback signal from the host XR computing device, which haptic feedback may be based on user input, and transmits the haptic feedback to the separable input device, via the electrical contact (106). Accordingly, the present input movement tracking device (100) not only tracks movement of an input device to which it is attached, but also relays user/sensor input from the input device to the host computing device.

While reference is made to transmitting haptic feedback, other data signals may be transmitted from the host computing device to the input device. For example, the data signals transmitted from the host computing device to the input device may include audio signals, signals to trigger/communicate with electronics on the input device etc.

Figure 2:
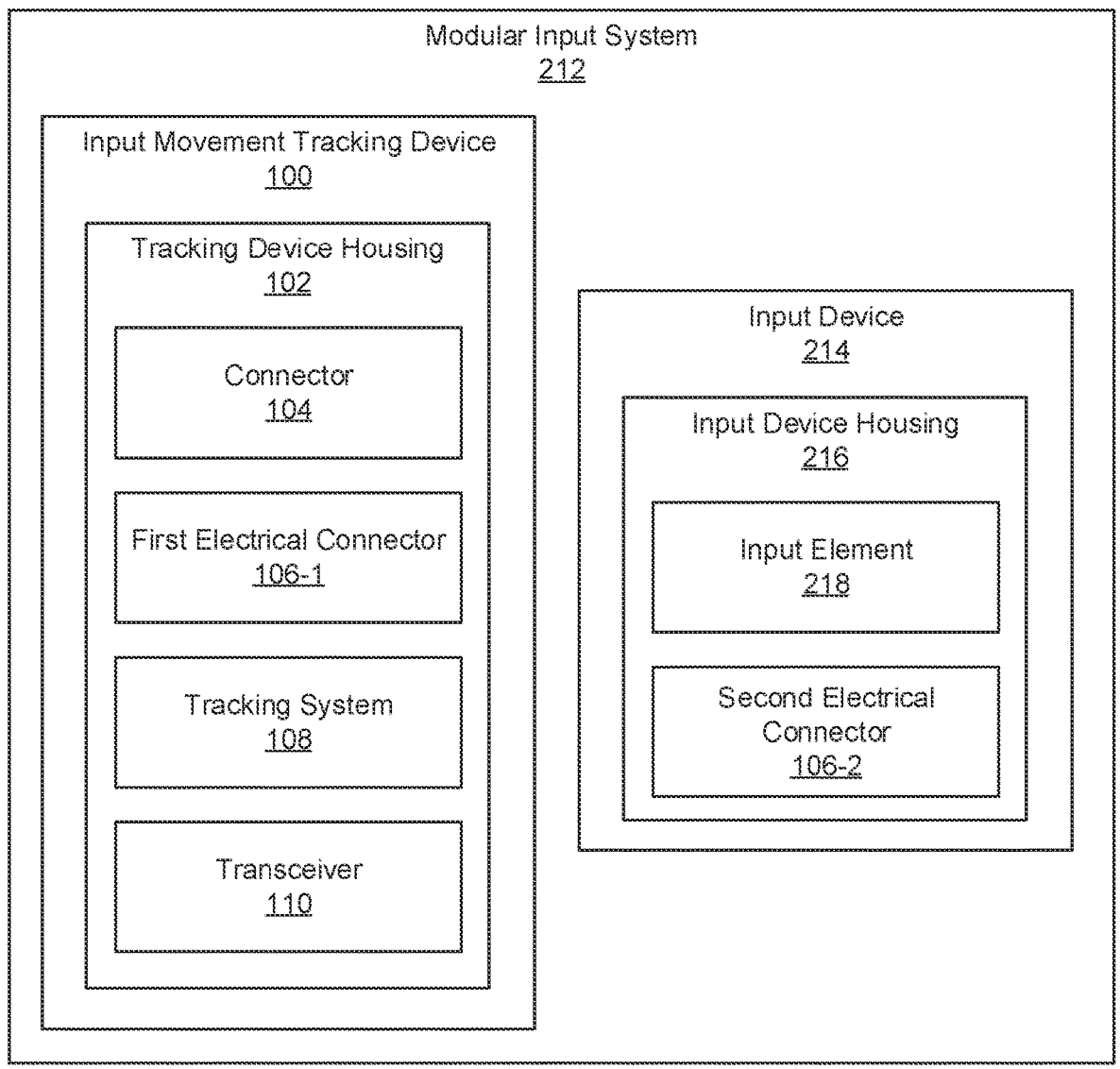
FIG. 2 is a block diagram of a modular input system, according to an example of the principles described herein.
Figure 6:
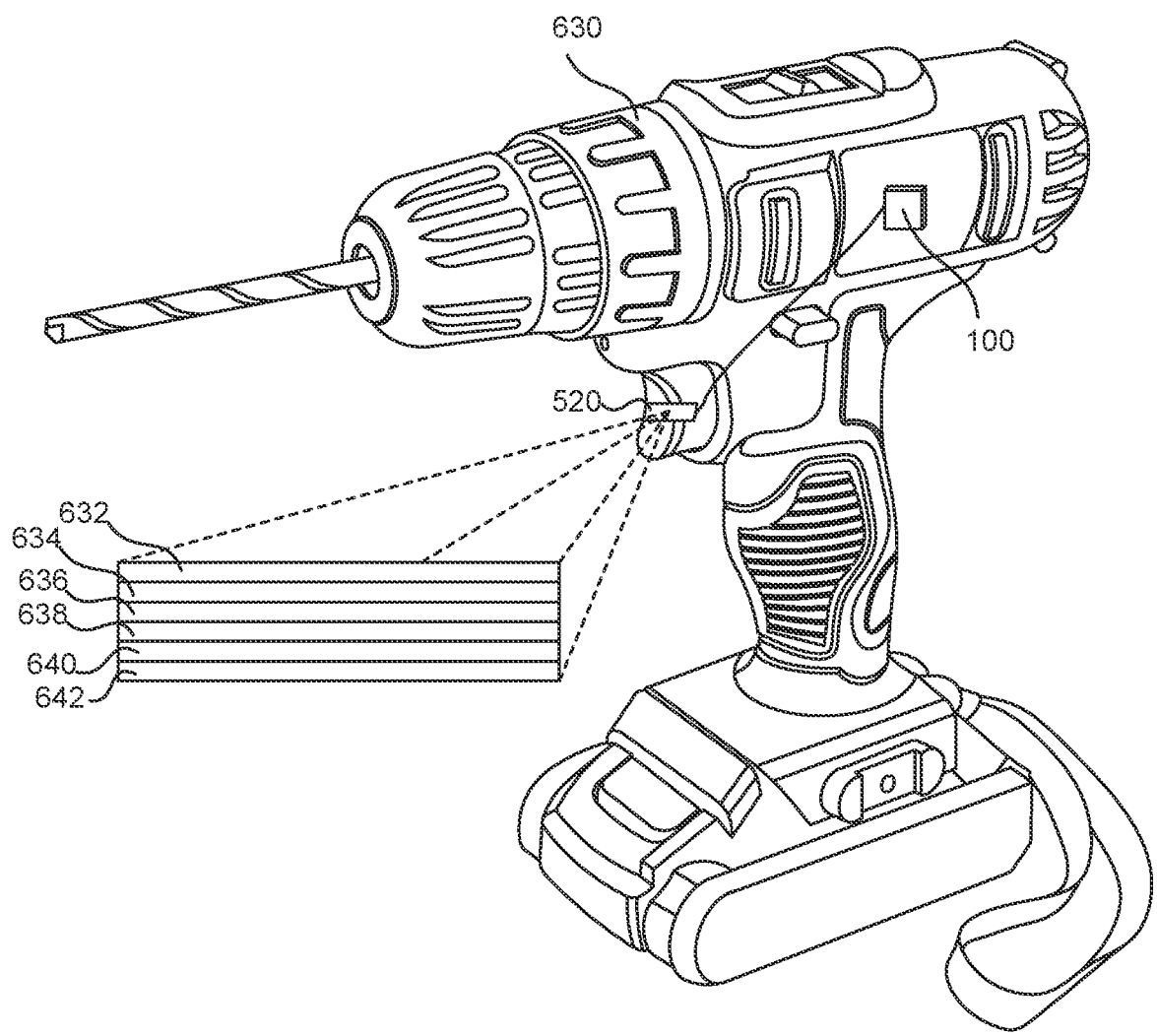
FIG. 6 is an isometric view of a flexible capacitive touch sensor on a non-electrical signal emitting physical object, according to an example of the principles described herein.
Figure 7:
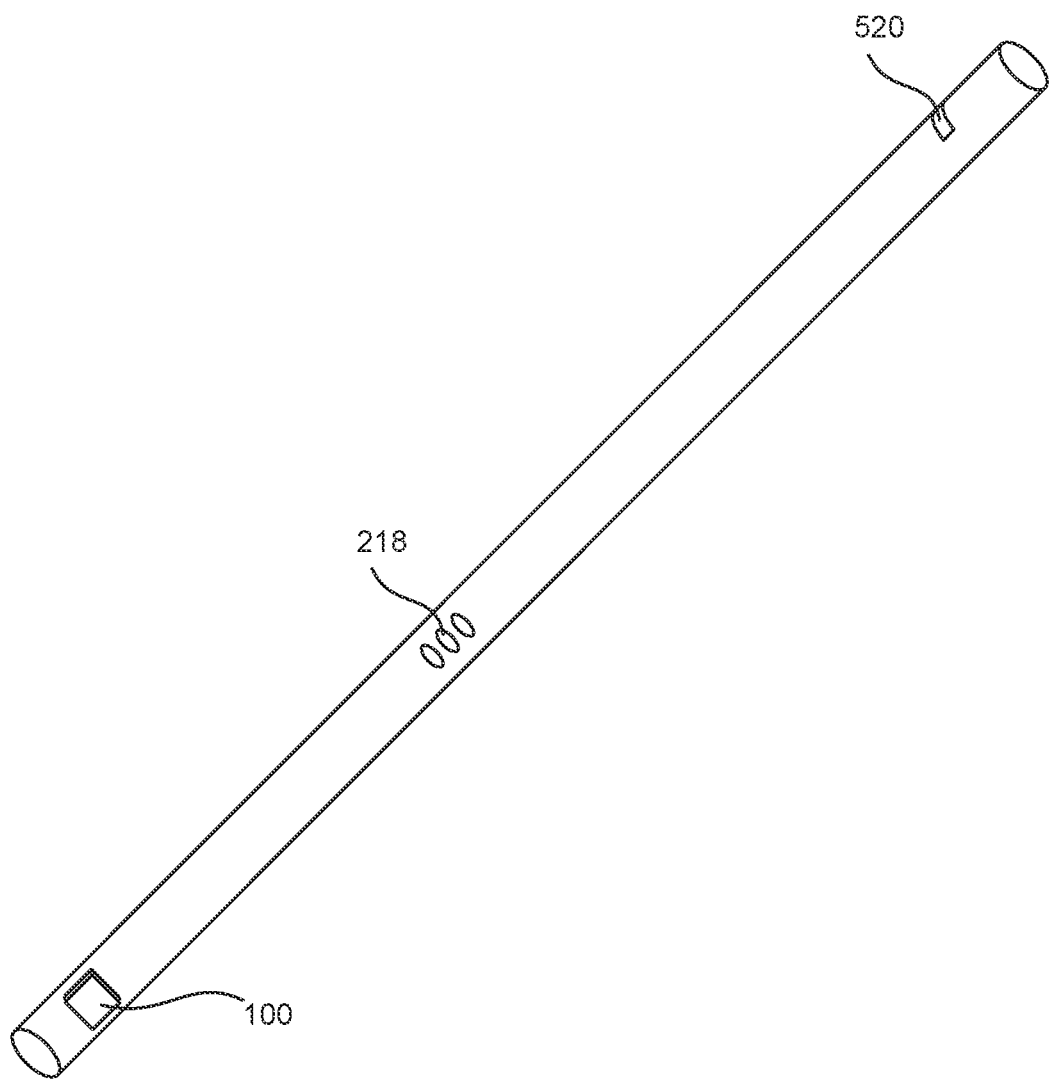
FIG. 7 is an isometric view of a flexible capacitive touch sensor on a non-electrical signal emitting physical object, according to an example of the principles described herein.

FIG. 2 is a block diagram of a modular input system (212), according to an example of the principles described herein. The modular input system (212) includes the input movement tracking device (100) as described above in connection with FIG. 1. The modular input system (212) also includes the input device (214) which is separable and modular to the input movement tracking device (100) as depicted in FIGS. 3 and 4. As described above, the input device (214) may take a variety of forms including a physical, non-computing object with no native user input elements as depicted in FIGS. 6 and 7. That is, such objects may not natively include elements that a user interacts with and which generate signals to manipulate a digital environment.

The input device (214) includes an input device housing (216) which is separate from and selectively affixable to the tracking device housing (102). The input device (214) includes an input element (218) which is integrated in the input device housing (216) and which receives input. For example, the input device (214) may be an electronic controller with user input elements (218) such as buttons, joysticks, direction pads, dials, wheels, levers, triggers, and sliders. As another specific example, the input device (214) may be a non-computing device and the input element (218) may be adhered to the body, or input device housing (216). In one specific example, the input element (218) may be a flexible capacitive touch sensor that is affixed to a physical object as depicted in FIGS. 6 and 7. While reference is made to user input elements (218), the input element (218) may be another type such as a sensor input. For example, the input element may be a magnetic sensor, a potentiometer, a gyroscope, a magnetometer, a proximity sensor, an ambient light sensor, or a microphone. While reference is made to input elements (218) that may be user input elements or sensors, the input device (214) may include a variety of different types of input elements (218).

The input device (214) also includes a second electrical connector (106-2) to interact with the first electrical connector (106-1) on the input movement tracking device (100) to transmit input to the input movement tracking device (100). As described above, the electrical connectors (106-1, 106-2) of both the input movement tracking device (100) and the input device (214) may have a variety of forms including combinations of pogo pins and electrical pads and wireless connectors (106).

FIG. 3 is an isometric view of a modular input system (212), according to an example of the principles described herein. As described above, the modular input system (212) includes an input movement tracking device (100) which is separable from an input device (214). Accordingly, the input device (214), which in this example is an electronic controller that includes input elements (218) such as buttons and a joystick to receive user input. Again, while reference is made to a particular type of input device (214) with particular input elements (218), the input device (214) may be of a variety of types which may be computing and non-computing input devices.

The input movement tracking device (100) includes the tracking system (108) to determine the position and orientation of the input movement tracking device (100) and/or the input device (214). Upon connection with the input movement tracking device (100), the input device (214) transmits the signals associated with the user input to the input movement tracking device (100) via the electrical connector (106). Any input, along with the position and orientation data is sent to the host computing device via the transceiver (110) of the input movement tracking device (100). Accordingly, as described above, the input device (214) is separable and modular to the input movement tracking device (100).

FIG. 4 is an isometric view of a modular input system (212) with various input devices (214), according to an example of the principles described herein. That is, as described above, the tracking device housing (102) is attachable to different types of input devices (214). Accordingly, the electromechanical interface (i.e., the connector (104) and the electrical connector (106)) of the input movement tracking device (100) and the input devices (214) may have a standard form factor such that the input movement tracking device (100) may be selectively attached to the variety of input devices (214).

Figure 5:
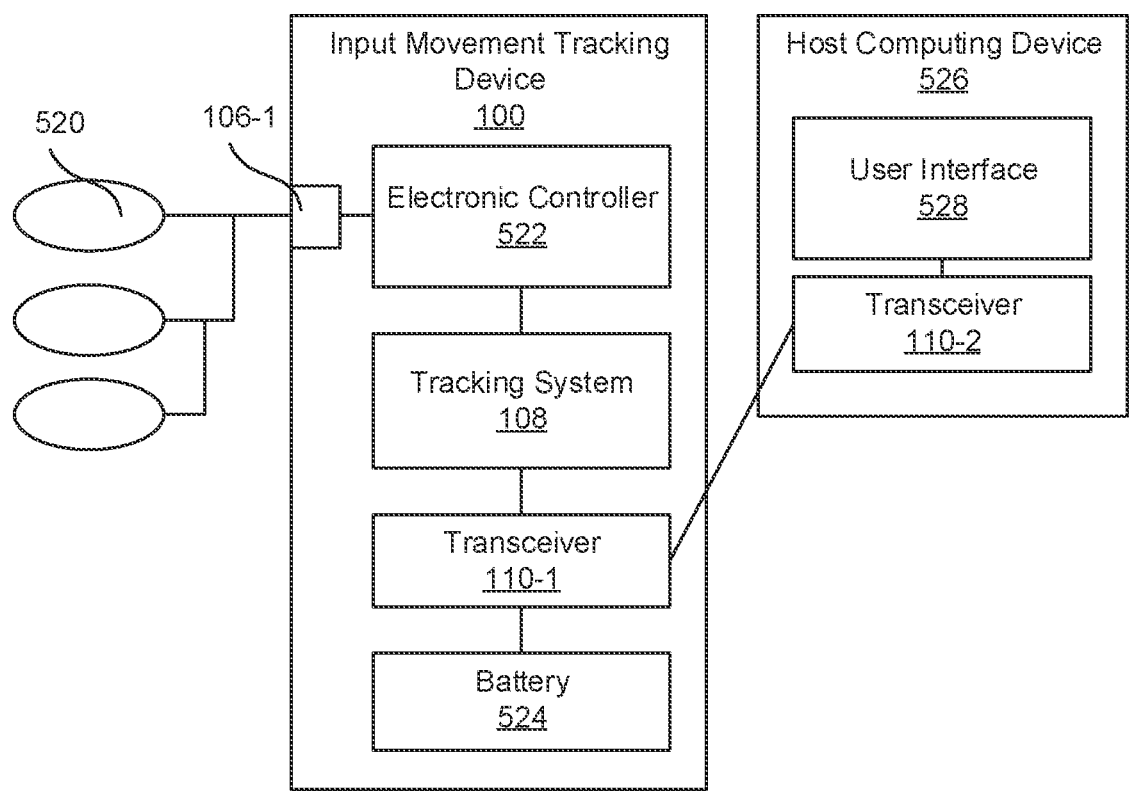
FIG. 5 is a block diagram of a modular input system with a flexible capacitive touch sensor, according to an example of the principles described herein.

As depicted in FIG. 4, in some examples the input devices (214) may be electronic controllers which in FIG. 4 are depicted as a glove input device (214-1), a game controller input device (214-2), and a golf club input device (214-3). In other examples, the input device (214) whose position is to be tracked is a non-computing input device which may not natively have input elements that collect input data to be transmitted to a host computing device. In FIG. 4, such devices are depicted as a drill input device (214-4) and a welding torch input device (214-5). In this example, input elements (218), such as flexible capacitive touch sensors mentioned above and depicted in FIG. 5 below, may be attached to the input device. Examples of flexible capacitive touch sensors are depicted in FIGS. 5-7 that follow. Accordingly, the modular input system (212) of FIG. 4 provides flexibility in tracking the movement of input devices (214) and even allows for the receiving of input from objects that do not inherently output such input.

FIG. 5 is a block diagram of a modular input system (212) with a flexible capacitive touch sensor (520), according to an example of the principles described herein. As described above, in some examples, the input element (218) is a flexible capacitive touch sensor (520) that may be adhered to any object, regardless of whether that object is natively capable of communicating with a host computing device (526). A capacitor is a circuit element that stores an electrical energy. A user's finger, or other object which can influence electric fields, in contact with or in proximity to a plate of the capacitor disturbs the electric field characteristics of the capacitor. A capacitive touch sensor (520) detects the change in the electric field characteristics responsive to a user's finger or other object and registers such as a touch or proximity input.

In an example, the capacitive touch sensor (520) may be a flexible capacitive touch sensor (520). Such a sensor may be made up of multiple flexible layers. As the layers are flexible, the capacitive touch sensor (520) may conform to the shape of the object to which it is attached. The flexible capacitive touch sensor (520) may be attached to the object in any number of ways. That is, the capacitive touch sensor (520) may include a retention mechanism to affix the flexible capacitive touch sensor (520) to the input device housing (216). In one example, the retention mechanism may be an adhesive film. The adhesive adheres the flexible capacitive touch sensor (520) to an object to be tracked. For example, as depicted in FIG. 6, the capacitive touch sensor (520) may be adhered to a trigger of a drill to register depression of the trigger of the drill and pass such a signal to the input movement tracking device (100) for ultimate transmission to the host computing device (526). Note that as depicted in FIG. 5, multiple capacitive touch sensors (520) may be adhered to an object and may therefore be used to register touch inputs on the object.

As described above, the capacitive touch sensors (520) are coupled to the input movement tracking device (100). In this example, the second electrical connector (106-2) may be the wires that are in electrical contact with the first electrical connector (106-1) of the input movement tracking device. In an example, the first electrical connector (106-1) may be a port to receive the wires. In another example, the first electrical connector (106-1) may similarly be wires that are wire-bonded to the capacitive sensors (520).

The input movement tracking device (100) may include components to process the touch input. That is, the input movement tracking device (100) provides capacitive sensor control, local processing, tracking system integration, and power. That is, the input movement tracking device (100) collects the touch input and prepares the signals for ultimate transmission to the host computing device (526).

To achieve its intended functionality, the input movement tracking device (100) may include various components. For example, the input movement tracking device (100) may include an electronic controller (522) to process inputs and outputs of the capacitive touch sensors (520). This electronic controller (522) may include, or be coupled to, a microcontroller that controls the system and controls other operations/components of the input movement tracking device (100) such as the tracking system (108) and transceiver (110-1). The electronic controller (522) may be a stand-alone integrated circuit, a capacitive sensing controller. In another example, the electronic controller (522) may be integrated into an integrated circuit along with a microprocessor core and capacitive touch controller.

As described above, the input movement tracking device (100) may include a tracking system (108), which determines the orientation of the tracking device in physical space. As described above, the tracking system (108) may include a variety of components to track the 6DoF of the input device (214), which components may include an inertial measurement unit, IR LED, accelerometer, and ultrasonic transceiver.

The input movement tracking device (100) also includes the transceiver (110-1) which may communicate with a corresponding transceiver (110-2) of the host computing device (526). In an example, the input movement tracking device (100) also includes a battery (524) to provide operating power to the various hardware components of the input movement tracking device (100).

In an example, the input movement tracking device (100) may be split into multiple configurations to better target the developmental goals. For example, a first input movement tracking device (100) may include a small number of inputs and a more granular tracking system (108). By comparison, a second input movement tracking device (100) may include more inputs and have a higher-resolution tracking system (108).

In an example, the modular input system (212) is coupled to a host computing device (526) which includes a user interface (528) generated on the host computing device (526) which allows for customization of the sensing settings of the flexible capacitive touch sensors (520) or another sensor. That is, the user interface (528) provides functionality and customization such that a user may integrate the modular input system (212) into their XR environment.

For example, via the user interface (528) a user may customize settings such as the real-time raw data collection, input sensitivity and range, setting a threshold for what force of input triggers a function, signal filtering, and many other adjustments. That is, the user interface (528) allows for the customization by which a user can change the settings for the flexible capacitive touch sensors (520). In an example, the user interface (528) may be used by applications for integration of the functionality into the experience of the application.

FIG. 6 is an isometric view of a flexible capacitive touch sensor (520) on a non-computing physical object, according to an example of the principles described herein. As described above, the present system facilitates receiving and transmitting input from a physical object that may not natively have such capability. That is, the present system includes device trackers which can be easily attached to or installed into physical devices, which in the example depicted in FIG. 6 is a drill (630) trigger. As such, this system allows for the use of real-world devices in an XR environment. Doing so may provide realistic feel and function, for example, when training in a virtual or augmented environment. The flexible capacitive touch sensor (520) does not need to be customized to each specific object to which it is attached, but can rather be coupled to any physical object via the adhesive backing, or other retention mechanism. Because the capacitive touch sensor (520) is flexible, it conforms to the shape of the object to which it is attached. The dimensions of the capacitive touch sensor (520) may be tailored to a particular application. Moreover, properties of the capacitive touch sensor (520) may be adjusted to fit the application as well. For example, the capacitive touch sensor (520) may be selected to have a particular sensitivity by, for example, adjusting the different physical characteristics of the capacitive touch sensor (520). Moreover, as described above, the capacitive touch sensor (520) settings may be adjusted via the user interface (528) described above.

FIG. 6 also depicts the input movement tracking device (100) which includes the tracking system (108) and transceiver (110) to track and communicate movement of the drill (630).

FIG. 6 also depicts a particular structure of the capacitive touch sensor (520). That is, the capacitive touch sensor (520) may be formed of layers of material that are joined together to ultimately provide a touch sensitive experience. For example, the capacitive touch sensor (520) may include an adhesive layer (642) to adhere the capacitive touch sensor (520) to the object surface. Overlay layers (632, 640) provide an aesthetic surface finish to the capacitive touch sensor (520), protect the metal layers (634, 638), and provide electrical isolation. The metal layers (634, 638) are separated from one another and provide the energy storage, or capacitive, functionality of the capacitive touch sensor (520). As described above, user contact with or proximity to the capacitive touch sensor (520) alters the electrical field characteristics surrounding the metal layers (634, 638). The alteration of the electrical field may be detected and identified as a touch or proximity input. A signal indicating the alteration of the electrical field is detected by the controller in the input movement tracking device (100) and ultimately forwarded to the host computing device (526). In an example, the capacitive touch sensor (520) may include an insulating layer (636) to provide electrical isolation between the metal layers (634, 638). Such a flexible capacitive sensor (520) allows for the bending and twisting of the sensor to conform to the shape of the object to which it is applied.

In some examples, the capacitive sensing function may be extended to include cases where an element interacts with the sensor input to change capacitance based on a distance from the capacitive touch sensor (520). In this way, mechanical movement and position could be detected separate from human interfacing. For example, the position of a trigger on an electric drill could be determined by placing the element and the sensor on mechanically-activated parts of the electric drill to detect trigger position.

In another example a metal plate may move closer or farther away from the capacitive elements, which would change capacitive characteristics of the sensor (520). This could be implemented in such a way that user proximity and touch would have a small influence compared to the influence of the plate. Accordingly, pressure, but not touch, is sensed.

FIG. 7 is an isometric view of a flexible capacitive touch sensor (520) on a physical object, according to an example of the principles described herein. In some examples, the tracking system (108) tracks a movement of a first input element, which in this example is a capacitive touch sensor (520) that is removed from other input elements (218) of the input device. For example, the capacitive sensor (520) may be positioned on a tip of a staff where movement tracking is desired, while the other input elements (218) are positioned near a middle of the staff where a user's hand may be.

FIG. 7 also depicts the input movement tracking device (100) which may be separated from the other input elements (218) and/or the capacitive touch sensor (520).

Figure 8:
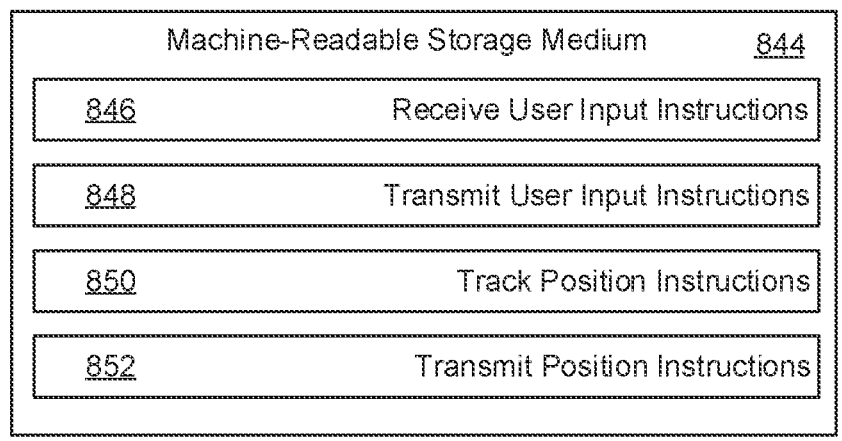
FIG. 8 depicts a non-transitory machine-readable storage medium for tracking an input device, according to an example of the principles described herein.

FIG. 8 depicts a non-transitory machine-readable storage medium (844) for tracking an input device (214), according to an example of the principles described herein. To achieve its desired functionality, the input movement tracking device (100) includes various hardware components. Specifically, the input movement tracking device (100) includes a processor and a machine-readable storage medium (844). The machine-readable storage medium (844) is communicatively coupled to the processor. The machine-readable storage medium (844) includes several instructions (846, 848, 850, 852) for performing a designated function. In some examples, the instructions may be machine code and/or script code.

The machine-readable storage medium (844) causes the processor to execute the designated function of the instructions (846, 848, 850, 852). The machine-readable storage medium (844) can store data, programs, instructions, or any other machine-readable data that can be utilized to operate the input movement tracking device (100). Machine-readable storage medium (844) can store machine-readable instructions that the processor of the input movement tracking device (100) can process, or execute. The machine-readable storage medium (844) can be an electronic, magnetic, optical, or other physical storage device that contains or stores executable instructions. Machine-readable storage medium (844) may be, for example, Random-Access Memory (RAM), an Electrically Erasable Programmable Read-Only Memory (EEPROM), a storage device, an optical disc, etc. The machine-readable storage medium (844) may be a non-transitory machine-readable storage medium (844).

Referring to FIG. 8, receive user input instructions (846), when executed by the processor, cause the processor to receive input at an input movement tracking device (100) and from a separable input device (214) of an XR system. Transmit user input instructions (848), when executed by the processor, cause the processor to, transmit the input to a host XR computing device (526). Track position instructions (850), when executed by the processor, cause the processor to, track a position and orientation of the input device (214) via a tracking system (108) of the input movement tracking device (100). Transmit position instructions (852), when executed by the processor, cause the processor to, transmit the position and orientation of the input device (214) to the host XR computing device (526).

In summary, using such a device, system, and machine-readable storage medium may, for example, 1) allow for different input devices of different types to be implemented with a single input movement tracking device; 2) facilitate different input styles (e.g., standard, pro), that may have more or less features; 3) facilitate different controller ergonomics (e.g., small, medium large; 4) facilitate integration of application specific controllers (e.g., sports equipment, pens, paint brushes) as well as user-made (e.g. 3D printed) controllers; 5) support multiple tracking systems on a single object; 6) allow tracking of non-computing physical objects. However, it is contemplated that the devices disclosed herein may address other matters and deficiencies in a number of technical areas, for example.

What is claimed is:

1. An input movement tracking device, comprising:
    a tracking device housing;
    a connector incorporated into the tracking device housing to mechanically attach the tracking device housing to an input device, the input device, when attached to the tracking device housing, being a handheld object that is to be represented by a host computing device in an extended reality (XR) environment;
    an electrical connector incorporated into the tracking device housing to receive user input from an input element of the input device to be transmitted to the host computing device;
    a tracking system disposed within the tracking device housing to track a position and orientation of the tracking device housing and the input device in physical space; and
    a transceiver disposed within the tracking device housing to communicate with the host computing device.

2. The input movement tracking device of claim 1, wherein:
    the input device comprises an input device housing that is separate from the tracking device housing; and
    the input device housing is separable and modular to the tracking device housing.

3. The input movement tracking device of claim 1, wherein the transceiver is a wireless transceiver.

4. The input movement tracking device of claim 1, wherein the connector of the tracking device housing is attachable to different types of handheld objects.

5. The input movement tracking device of claim 1, wherein the connector comprises an adhesive film.

6. The input movement tracking device of claim 1, wherein the input device comprises multiple elements selectively detachable from each other, and the tracking system tracks a movement of a first element of the input device that is removed from other elements of the input device.

7. The input movement tracking device of claim 1, wherein the connector comprises a threaded attachment.

8. The input movement tracking device of claim 1, wherein the tracking system comprises an optical constellation tracking system.

9. The input movement tracking device of claim 1, wherein the tracking system comprises an ultrasonic tracking system.

10. The input movement tracking device of claim 1, wherein the input device input element comprises a capacitive touch sensor attachable to the handheld object.

11. The input movement tracking device of claim 1, wherein the input device outputs haptic feedback to a user of the handheld object based a haptic feedback signal received from the host computing device.

12. A modular input system, comprising:
an input movement tracking device, comprising:
a tracking device housing;
a connector incorporated into the tracking device housing to mechanically attach the tracking device housing to an input device, the input device, when attached to the tracking device housing, being a handheld object that is represented by a host computing device in an extended reality (XR) environment;
a first electrical connector incorporated into the tracking device housing to receive user input from an input element of the input device, which input is to be transmitted to the host computing device;
a tracking system disposed within the tracking device housing to track a position and orientation of the tracking device housing and the input device in physical space; and
a transceiver disposed within the tracking device housing to communicate with the host computing device; and
the input device which is separable and modular to the input movement tracking device, the input device comprising:
an input device housing;
the input element integrated with the input device housing, the input element to receive input; and
a second electrical connector to interact with the first electrical connector of the tracking device to transmit input from the input element to the input movement tracking device.

13. The modular input system of claim 12, wherein:
the input element comprises a flexible capacitive touch sensor to detect a touch input; and
the input device further comprises a retention mechanism to affix the flexible capacitive touch sensor to the input device housing.

14. The modular input system of claim 12, wherein the handheld object is a non-computing device.

15. The modular input system of claim 12, wherein the input element comprises a flexible capacitive touch sensor.

16. The modular input system of claim 12, further comprising a user interface generated on the host computing device to control the representation of the handheld object in the XR environment based on operation of the input element.

17. The modular input system of claim 12, wherein:
the input device comprises an electronic controller; and
the input element comprises:
a user input element;
a magnetic sensor;
a potentiometer;
a gyroscope; or
a combination thereof.

18. A non-transitory machine-readable storage medium encoded with instructions executable by a processor, the machine-readable storage medium comprising instructions to:
receive input at a tracking device housing of an input movement tracking device and user input from a separable input device, the input movement tracking device being part of an extended reality (XR) system, the input movement tracking device being separate from a head-mounted display (HMD) of the XR system, wherein the separable input device, when attached to the input movement tracking device, is a handheld object that is represented by a host XR computing device in an XR environment;
transmit the user input from the input device to the host XR computing device using a transceiver within the tracking device housing;
track a position and orientation of the separable input device using the input from the tracking device housing via a tracking system of the tracking device housing; and
transmit the position and orientation of the separable input device to the host XR computing device.

19. The non-transitory machine-readable storage medium of claim 18, further comprising instructions, executable by the processor, to cause the processor to transmit the input and position and orientation to the HMD of the XR system for display on the HMD.

20. The non-transitory machine-readable storage medium of claim 18, further comprising instructions, executable by the processor, to cause the processor to:
receive a data signal from the host XR computing device, wherein the data signal is based on the input; and
transmit the data signal to the separable input device.

* * * * *